(12) United States Patent
Boi et al.

(10) Patent No.: US 12,265,146 B2
(45) Date of Patent: Apr. 1, 2025

(54) PEAK DETECTOR CALIBRATION (71) Applicant: Infineon Technologies AG, Neubiberg (DE)

(72) Inventors: Giovanni Boi, Villach (AT); Fabio Padovan, Villach (AT); Luigi Grimaldi, Villach (AT); Dmytro Cherniak, Villach (AT)

(73) Assignee: Infineon Technologies AG, Neubiberg (DE)

( * ) Notice: Subject to any disclaimer, the term of this patent is extended or adjusted under 35 U.S.C. 154(b) by 138 days.

(21) Appl. No.: 18/159,413

(22) Filed: Jan. 25, 2023

(65) Prior Publication Data

US 2024/0248161 A1 Jul. 25, 2024

(51) Int. Cl.
*G01R 35/00* (2006.01)
*G01R 19/04* (2006.01)

(52) U.S. Cl.
CPC .......... *G01R 35/005* (2013.01); *G01R 19/04* (2013.01)

(58) Field of Classification Search
CPC .... G01R 19/04; G01R 35/005; H03B 5/1212; H03B 5/1228; H03B 5/1234; H03B 5/1265; H03B 5/1271; H03B 5/1278; H03L 5/00

USPC .......................................................... 324/74
See application file for complete search history.

(56) References Cited

U.S. PATENT DOCUMENTS 11,079,415 B2 * 8/2021 Bassi .................... H03B 5/1234
2014/0225676 A1 * 8/2014 Hsieh ........................ H03L 5/00
                                                                    331/25

OTHER PUBLICATIONS

Parkalian, N. et al., "Analysis and Design of Amplitude Error Detector and Digital Control Loop to Increase Reliability of PLL," IEEE, 2017, 4 pages.

* cited by examiner

*Primary Examiner* — Paresh Patel
*Assistant Examiner* — Rahul Maini
(74) *Attorney, Agent, or Firm* — Harrity & Harrity, LLP (57) ABSTRACT

A calibration circuit may include a calibration signal generator configured to receive an oscillator signal provided by an oscillator and generate a calibration signal based on the oscillator signal. The calibration signal may be generated to have a predetermined amplitude. The calibration circuit may include a calibration peak detector configured to detect a peak amplitude of the calibration signal. The calibration circuit may include a logic circuit configured to calibrate a peak detector connected to the oscillator based at least in part on the peak amplitude of the calibration signal.

23 Claims, 6 Drawing Sheets

PEAK DETECTOR CALIBRATION

BACKGROUND

Performance of an oscillator performance may be impacted by phase noise. To alleviate phase noise, a topology of the oscillator may be selected so as to maximize a quality of passive components and/or maximize an amplitude of oscillation. In operation, the amplitude of oscillation may be set to be as high as possible without exceeding a reliability limit. If the reliability limit is exceeded, then an impact of phase noise on performance of the oscillator over time will increase. Further, if the amplitude of oscillation is not maximized, then the phase noise itself will not be minimized. A peak detector may be utilized in order to monitor an oscillator. In general, a peak detector detects an amplitude of oscillation and outputs a voltage signal that is proportional to the detected amplitude.

SUMMARY

In some implementations, a calibration circuit includes a calibration signal generator configured to: receive an oscillator signal provided by an oscillator, and generate a calibration signal based on the oscillator signal, the calibration signal being generated to have a predetermined amplitude; a calibration peak detector configured to detect a peak amplitude of the calibration signal; and a logic circuit configured to calibrate a peak detector connected to the oscillator based at least in part on the peak amplitude of the calibration signal.

In some implementations, a method includes receiving, by a calibration signal generator, an oscillator signal; generating, by the calibration signal generator, a calibration signal using the oscillator signal, the calibration signal having a predetermined amplitude; detecting, by a calibration peak detector, a peak amplitude of the calibration signal; determining, by a logic circuit, a gain of the calibration peak detector based at least in part on the peak amplitude; and calibrating, by the logic circuit, a peak detector based at least in part on the gain of the calibration peak detector.

In some implementations, a calibration circuit includes a voltage regulator configured to supply a buffer with a selectable supply voltage; a buffer configured to generate a calibration signal based on an oscillator signal and the selectable supply voltage; a filter configured to modify a waveform of the calibration signal; a calibration peak detector configured to detect peak amplitudes of the calibration signal; and a logic circuit configured to calibrate a peak detector based at least in part on the peak amplitudes of the calibration signal.

DETAILED DESCRIPTION

The following detailed description of example implementations refers to the accompanying drawings. The same reference numbers in different drawings may identify the same or similar elements.

Reliable performance of an oscillator in a system (e.g., a radar system) is important to ensure safe and reliable system performance. As noted above, performance of the oscillator can be impacted by phase noise. In general, there can be multiple sources of noise that contribute to phase noise of an oscillator. Alleviation of phase noise can be provided through, for example, (a) selection of an oscillator topology, (b) maximization of a quality factor of passive components, and/or (c) maximization of an amplitude of oscillation. In practice, once the topology of the oscillator has been selected and the passive components designed, the amplitude of oscillation must be precisely set—it should be as high as possible without exceeding a reliability limit. As noted above, if the reliability limit is exceeded, then phase noise performance of the oscillator decreases over time. Further, if the amplitude of oscillation is not maximized, then phase noise itself is not minimized.

Some systems may include a circuit configured to detect an amplitude of oscillation of an oscillator. Such a component is referred to as a peak detector. In operation, information indicating the amplitude of oscillation of the oscillator can be used to set a bias current of the oscillator, thereby enabling control of the amplitude of oscillation of the oscillator (e.g., so that the oscillator oscillates with a desired amplitude). However, one challenge related to peak detector operation is to ensure accurate peak amplitude detection over process, voltage, and temperature (PVT) variations. That is, a transfer function of the peak detector from input oscillation amplitude to output voltage needs over PVT variations should be known so as to enable accurate and reliable peak detection.

A conventional peak detector includes a capacitor and a pair of transistors. The transistors have a gate coupled to outputs of the oscillator. Nonlinearities of the pair of transistors enable an amplitude of oscillation to be collected as a current in the capacitor, which increases a voltage signal as the oscillator amplitude increases. The conventional peak detector also includes a reference circuit that provides a reference signal. Here, if the oscillator is off and has zero amplitude, then the voltage signal is equal to the reference signal. If characteristics of the capacitor, the transistors, and the current supplied to the oscillator are known, then the amplitude of oscillation and the output voltage (e.g., output voltage=voltage signal-reference signal) are directly correlated. In practice, to detect an exact amplitude of oscillation of the oscillator, characteristics of components of the peak detector need to be known. That is, a value of the capacitor and nonlinear transconductances of the transistors need to be known. However, the capacitor value and the transistor nonlinear transconductances can vary with respect to process, temperature, and/or voltage. Therefore, the conventional peak detector alone cannot be used to ensure that an amplitude of oscillation of an oscillator is accurately detected over PVT variations. To provide accurate oscillation amplitude information over PVT variation, a calibration of the peak detector is needed.

One technique for calibration of a peak detector is to include a calibration oscillator in a control circuit associated with the oscillator, with the calibration oscillator being a replica of the oscillator. According to this technique, the calibration oscillator is controlled so as to oscillate at two predetermined amplitudes, and a calibration peak detector detects the peak of the calibration oscillator. A gain of a peak detector is calculated by interpolation based on the peaks as detected by the calibration peak detector. Such a technique enables a gain curve of the peak detector to be defined to account for PVT variations. However, as noted above, this technique requires a calibration oscillator. Therefore, a size of the calibration circuit is significantly increased to accommodate the calibration oscillator (e.g., due to a need for an inductor), meaning that an amount of area consumed by the calibration circuit may be impractical or impossible to implement in a given system.

Some implementations described herein enable improved peak detector calibration. In some implementations, a calibration circuit may include a calibration signal generator configured to receive an oscillator signal provided by an oscillator, and generate a calibration signal based on the oscillator signal. Here, the calibration signal may be generated so as to have a predetermined amplitude. The calibration circuit may further include a calibration peak detector configured to detect a peak amplitude of the calibration signal, and a logic circuit configured to calibrate a peak detector connected to the oscillator based at least in part on the peak amplitude of the calibration signal. Notably, according to the implementations described herein, the calibration circuit generates the calibration signal based on the oscillator signal itself (e.g., rather than using a signal provided by a calibration oscillator). In this way, peak detector calibration can be enabled so as to provide accurate detection of an amplitude of oscillation of an oscillator over PVT variations significantly increasing an area of the calibration circuit. Additional details are provided below.

Figure 1:
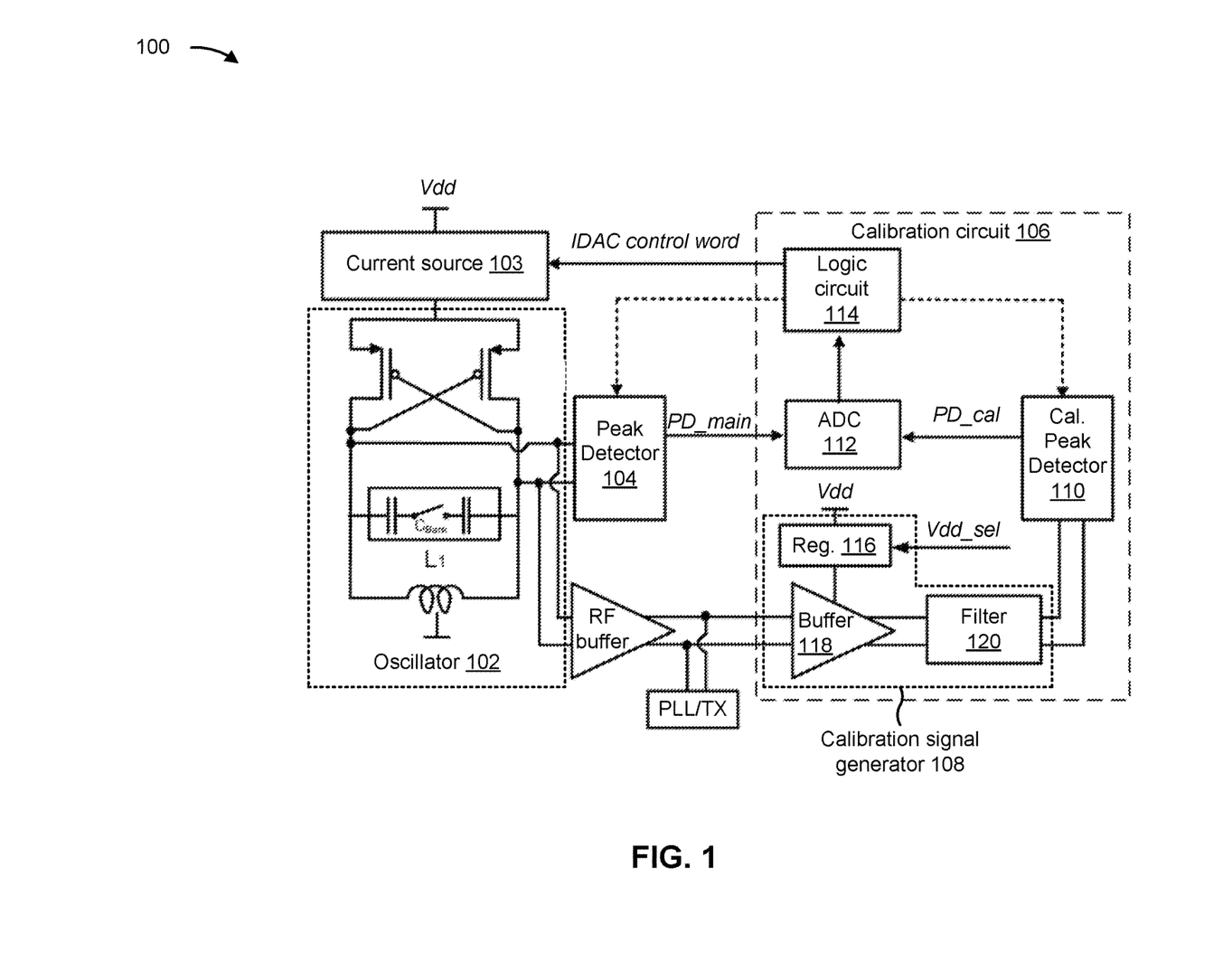
FIG. 1 is a diagram of a system including a calibration circuit for providing peak detector calibration, as described herein.

FIG. 1 is a diagram of a system 100 including a calibration circuit for providing peak detector calibration, as described herein. As shown in FIG. 1, the system 100 includes an oscillator 102, a current source 103, a peak detector 104, and a calibration circuit 106 including a calibration signal generator 108, a calibration peak detector 110, an analog-to-digital convertor (ADC) 112, and a logic circuit 114. As further shown, the calibration signal generator 108 in some implementations may include a voltage regulator 116, a buffer 118, and a filter 120.

The oscillator 102 is a component configured to generate an oscillating signal (herein referred to as an oscillator signal). In some implementations, the oscillator 102 may be implemented in a radio frequency (RF) system generating RF signals above approximately 1 gigahertz (GHz) (for example, signals in a millimeter wave frequency band (e.g., the V band or the W band)). As shown in FIG. 1, the oscillator 102 may in some implementations include a resonant tank including an inductor $L_1$ and a capacitor $C_{Bank}$. As shown in FIG. 1, the oscillator 102 may be configured to provide an output signal to the peak detector 104 and to the calibration circuit 106 (e.g., via an RF buffer).

The current source 103 is a component configured to supply current to the oscillator 102 (e.g., to enable the oscillator 102 to generate the oscillator signal). In some implementations, the current source 103 is programmable, meaning that the current source 103 can be controlled based on a signal provided by another component of the system 100.

For example, the current source 103 may in some implementations be controlled based on a current digital-to-analog convertor (IDAC) control word communicated by the logic circuit 114 included in the calibration circuit 106. In this way, the current supply to the oscillator 102 and, therefore, the amplitude of oscillation of the oscillator 102, can be controlled by the logic circuit 114 using the current source 103.

The peak detector 104 is a component configured to detect a peak amplitude of the oscillator signal generated by the oscillator 102. In some implementations, as shown in FIG. 1, the peak detector 104 is configured to provide an output signal PD_main (e.g., a signal indicating the peak amplitude as detected by the peak detector 104) to the calibration circuit 106 (e.g., to the ADC 112). In some implementations, the peak detector 104 may be calibrated or otherwise controlled by the calibration circuit 106 to, for example, account for PVT variations that could impact reliability or performance of the peak detector 104, as described herein. Additional details regarding the peak detector 104 are provided with respect to FIG. 5.

The calibration circuit 106 is a circuit configured to calibrate the peak detector 104. In some implementations, the calibration circuit 106 comprises the calibration signal generator 108, the calibration peak detector 110, the ADC 112, and the logic circuit 114. In some implementations, the calibration circuit 106 calibrates the peak detector 104 based on determining a gain of the calibration peak detector 110, as described herein. Notably, the calibration circuit 106 provides calibration of the peak detector 104 using the oscillator signal generated by the oscillator 102 (e.g., rather than using a signal generated by a calibration oscillator) meaning that a second (calibration) oscillator is not required in system 100, thereby reducing a size of the system 100.

In some implementations, the calibration signal generator 108 receives the oscillator signal provided by the oscillator 102 and generates a calibration signal based on the oscillator signal. In some implementations, the calibration signal generator 108 generates the calibration signal such that the calibration signal has a predetermined (e.g., known, well-defined) amplitude. In some implementations, as shown in FIG. 1, the calibration signal generator 108 includes the voltage regulator 116, the buffer 118, and the filter 120.

The voltage regulator 116 is a component configured to supply the buffer 118 with a selectable supply voltage associated with generating the calibration signal. That is, the voltage regulator 116 may be configured to generate one or more selectable supply voltages for supplying the buffer 118. In some implementations, the voltage regulator 116 generates the selectable supply voltage based on a supply voltage Vdd and a selection signal Vdd_sel (e.g., a signal at a select terminal of the voltage regulator 116). For example, the voltage regulator 116 may generate a first selectable supply voltage based on a level of the selection signal Vdd_sel during a first time window, and may generate a second (different) selectable supply voltage based on a level of the selection signal Vdd_sel during a second time window. Thus, the selection signal Vdd_sel may be used to control the selectable supply voltage supplied to the buffer 118 by the voltage regulator 116 during a given time window. In some implementations, the voltage regulator 116 may be, for example, a low-dropout (LDO) regulator or another type of supply voltage regulator.

The buffer 118 is a buffer configured to generate a calibration signal based on the oscillator signal provided by the oscillator 102 and the selectable supply voltage supplied by the voltage regulator 116. As shown in FIG. 1, the buffer 118 may be connected to an RF buffer, which is typically included in an oscillator design in order to connect an oscillator output to a phase locked loop (PLL) loop or to a transmitter; therefore, the buffer 118 does not load the resonant tank of the oscillator 102, which could otherwise result in a change in a frequency of the oscillator 102 or a degradation in phase noise of the oscillator 102. As noted above, the voltage regulator 116 may supply the buffer 118 at a selectable supply voltage based on the selection signal Vdd_sel. Thus, the calibration signal generated by the buffer 118 has a predetermined (e.g., known, well-defined) amplitude at a given time. For example, the buffer 118 may generate the calibration signal to have a first predetermined amplitude Vdd1 during a first time window based on a first selectable supply voltage supplied by the voltage regulator 116, and may generate the calibration signal to have a second (different) predetermined amplitude Vdd2 during a second time window based on a second selectable supply voltage supplied by the voltage regulator 116. In some implementations, the buffer 118 outputs a rail-to-rail signal. That is, the buffer 118 may be configured to generate the calibration signal such that the calibration signal spans an entire range from a maximum voltage (e.g., a predetermined amplitude, such as Vdd1 or Vdd2) to a minimum voltage (e.g., ground or a minimum negative voltage). In some implementations, the buffer 118 may be, for example, a complementary metal-oxide-semiconductor (CMOS) buffer. In general, the buffer 118 may be any buffer capable of generating a rail-to-rail calibration signal (e.g., a buffer that does not use a current mirror, since the use of a current bias does not guarantee a rail-to-rail signal).

The filter 120 is a component configured to modify a waveform of the calibration signal generated by the buffer 118 to cause the calibration signal to have a sinusoidal waveform. For example, the peak detector 104 may be implemented as an integrator and may be configured to receive the oscillator signal from the oscillator 102, with the oscillator signal having a sinusoidal waveform. Here, the calibration peak detector 110 may be similarly implemented as an integrator (e.g., the calibration peak detector 110 may be a replica of the peak detector 104). Therefore, the calibration signal at an input of the calibration peak detector 110 should have a sinusoidal waveform. However, the calibration signal at the output of the buffer 118 may have a square waveform. Thus, the filter 120 may in some implementations shape the calibration signal to cause the calibration signal to have a sinusoidal waveform at the input of the calibration peak detector 110. In some implementations, the filter 120 may be, for example, a low pass filter, a notch filter, or another type of filter that can serve to shape the waveform of the calibration signal.

The calibration peak detector 110 is a component configured to detect a peak amplitude of the calibration signal generated by the calibration signal generator 108. In some implementations, the calibration peak detector 110 is a replica of the peak detector 104. For example, the calibration peak detector 110 may be implemented using the same architecture as the peak detector 104. In some implementations, the calibration peak detector 110 and the peak detector 104 may be physically near one another within the system 100 to improve matching (e.g., such that conditions at the calibration peak detector 110 are similar to those at the peak detector 104). In some implementations, one or more other matching techniques may be used to implement the calibration peak detector 110 and the peak detector 104. Here, because the calibration peak detector 110 and the peak detector 104 may be substantially similar (e.g., with respect to architecture, physical placement, conditions experienced, or the like), a gain of the calibration peak detector 110 may be indicative of (e.g., may match or be similar to) a gain of the peak detector 104. In some implementations, the calibration peak detector 110 may comprise or be coupled to a memory (not shown). In some implementations, the memory may be configured to store (e.g., in a lookup table) information associated with a peak amplitude detected by the calibration peak detector 110. Additional details regarding the calibration peak detector 110 are provided with respect to FIG. 5.

The ADC 112 is a component configured to sample and convert an output signal PD_cal of the calibration peak detector 110 and provide the sampled and converted output signal PD_cal to the logic circuit 114. That is, the ADC 112 may be configured to convert the analog output of the calibration peak detector 110 to a digital signal, and provide the digital signal to the logic circuit 114. Similarly, as shown in FIG. 1, the ADC 112 may be coupled to the peak detector 104. Thus, the ADC 112 may be configured to sample and convert an output signal PD_main of the peak detector 104 and provide the sampled and converted output signal PD_main to the logic circuit 114.

The logic circuit 114 is a component configured to calibrate the peak detector based at least in part on the peak amplitude of the calibration signal. For example, the logic circuit 114 may be configured to determine a gain of the calibration peak detector 110 based on an interpolation of peak amplitudes of the calibration signal detected by the calibration peak detector 110, and to calibrate the peak detector 104 based on the determined gain. Further, in some implementations, the logic circuit 114 may be configured to adjust the IDAC control word of the current source 103 to control the peak amplitude of the oscillator 102 based on a detected peak amplitude of the oscillator signal of the oscillator 102. In some implementations, the logic circuit 114 may be further configured to provide digital control signals to one or more other components of the system 100, such as power-on/off signals to the peak detector 104, the calibration peak detector 110, or the ADC 112. In some implementations, the logic circuit 114 may be a digital logic circuit.

As indicated above, FIG. 1 is provided as an example. Other examples may differ from what is described with regard to FIG. 1. The number and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single component, or a single component shown in FIG. 1 may be implemented as multiple, distributed components. Additionally, or alternatively, a set of components (e.g., one or more components) shown in FIG. 1 may perform one or more functions described as being performed by another set of components shown in FIG. 1.

Figure 2:
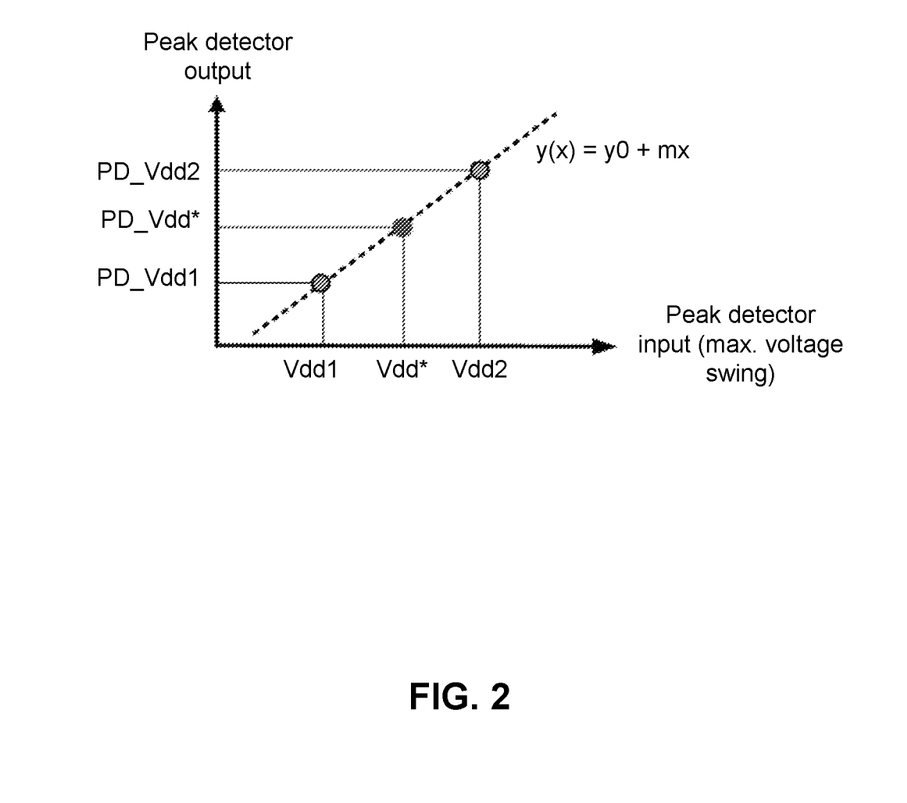
FIG. 2 is a diagram illustrating an example associated with a calibration procedure performed by the calibration circuit described herein.

FIG. 2 is a diagram illustrating an example associated with a calibration procedure performed by the calibration circuit 106 in the system 100.

In an example of the calibration procedure, the buffer 118 may be powered on (e.g., based on a control signal from the logic circuit 114). Next, during a first time window (e.g., a first period of time), the voltage regulator 116 is provided with a selection signal Vdd_sel at a level that causes the voltage regulator 116 to generate a first selectable supply voltage. Here, the buffer 118 generates the calibration signal to have a first predetermined amplitude Vdd1 based on the first selectable supply voltage. The filter 120 then modifies the calibration signal to cause the calibration signal to have a sinusoidal waveform at an input of the calibration peak detector 110. The calibration peak detector 110 detects a peak amplitude of the calibration signal during the first time window and provides an output signal PD_Cal_Vdd1. Here, the peak amplitude of the output signal PD_Cal_Vdd1 is predetermined (e.g., known). The ADC 112 samples and converts the output signal PD_Cal_Vdd1 and provides the sampled and converted output signal PD_Cal_Vdd1 to the logic circuit 114.

Next, the voltage regulator 116 is provided with a selection signal Vdd_sel at a level that causes the voltage regulator 116 to generate a second selectable supply voltage (e.g., a supply voltage that differs from the first selectable supply voltage). Here, the buffer 118 generates the calibration signal to have a second predetermined amplitude Vdd2 based on the second selectable supply voltage. The filter 120 then modifies the calibration signal to cause the calibration signal to have a sinusoidal waveform at an input of the calibration peak detector 110. The calibration peak detector 110 detects a peak amplitude of the calibration signal during the second time window and provides an output signal PD_Cal_Vdd2. Here, the peak amplitude of the output signal PD_Cal_Vdd2 is predetermined (e.g., known). The ADC 112 samples and converts the output signal PD_Cal_Vdd2 and provides the sampled and converted output signal PD_Cal_Vdd2 to the logic circuit 114.

Next, as indicated in FIG. 2, a gain of the calibration peak detector 110 is calculated by interpolation. For example, the logic circuit 114 may interpolate the peak amplitudes of the calibration signal as detected by the calibration peak detector 110 in order to derive a transfer function of a gain of the calibration peak detector 110. As shown in FIG. 2, the transfer function may in some implementations be a linear transfer function that defines a relationship of input voltages of the calibration peak detector 110 (e.g., Vdd1, Vdd2) to output voltages of the calibration peak detector 110 (e.g., PD_Vdd1, PD_Vdd2). In some implementations, the transfer function may be a linear function (e.g., as shown in FIG. 2). Alternatively, the transfer function may be a non-linear transfer function (e.g., when the logic circuit 114 uses more than two interpolation points). In some implementations, the logic circuit 114 may derive multiple transfer functions (e.g., a linear transfer function and a non-linear transfer function). In this way, a gain curve of the calibration peak detector 110 and, therefore, the peak detector 104, is well defined to account for a process and a current voltage and temperature associated with the system 100.

In some implementations, as illustrated in the example associated with FIG. 2, the logic circuit 114 may determine the gain of the peak detector 104 using one or more peak amplitudes of the calibration signal. For example, the logic circuit 114 may in some implementations utilize a single peak amplitude of the calibration signal. That is, the logic circuit 114 may in some implementations be configured to implement a single point calibration by, for example, setting the supply to Vdd* (e.g., a desired voltage swing of the oscillator 102). As another example, the logic circuit 114 may utilize three or more peak amplitudes of the calibration signal (e.g., each associated with a different predetermined amplitude of the calibration signal as generated by the calibration signal generator 108). In some implementations, the use of three or more peak amplitudes may enhance accuracy of the calibration procedure.

In some implementations, the calibration circuit 106 may repeat the calibration procedure at a later time. For example, the calibration circuit 106 may repeat the calibration procedure on a periodic basis. As another example, the calibration circuit 106 may repeat the calibration procedure based on detecting (e.g., using an on-chip temperature sensor) that a temperature in an environment of the system 100 has changed by a threshold amount or has reach a threshold temperature. As another example, the calibration circuit 106 may repeat the calibration procedure based on detecting that the supply voltage Vdd to the oscillator 102 has changed (e.g., increased or decreased) by a threshold amount.

In some implementations, after a desired peak detector output is known, the logic circuit 114 may set the IDAC control word provided to the oscillator 102 so as to cause the amplitude of oscillation to be nearer to a desired oscillation amplitude. The process may be repeated until the amplitude of oscillation of the oscillator 102 matches (e.g., is approximately equal to) the desired oscillation amplitude, thereby reducing or minimizing phase noise.

In this way, the calibration circuit 106 may provide calibration for the peak detector 104 that allows a gain of the peak detector 104, and therefore an amplitude of the voltage signal at an input of the peak detector 104, to be known with high precision and minimum area occupation.

As indicated above, FIG. 2 is provided as an example. Other examples may differ from what is described with regard to FIG. 2.

Figure 3:
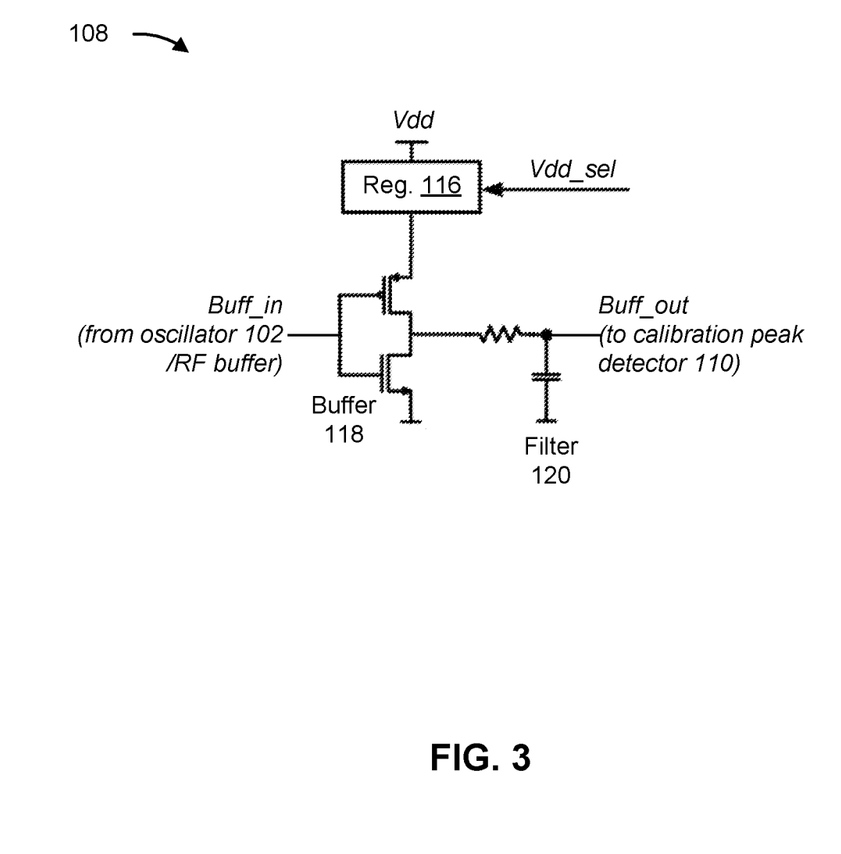
FIG. 3 is a diagram illustrating an example implementation of the calibration signal generator including a voltage regulator, a buffer, and a filter, as described herein.

FIG. 3 is a diagram illustrating an example implementation of the calibration signal generator 108 including the voltage regulator 116, the buffer 118, and the filter 120.

As described above, the buffer 118 (e.g., a CMOS buffer) receives the oscillator signal (e.g., identified as Buff_in in FIG. 3) at an input of the buffer 118. The voltage regulator 116 (e.g., an LDO regulator) provides a selectable supply voltage at one or more voltage levels (e.g., Vdd1 and Vdd2) such that a signal (e.g., Buff_out) at an output of the calibration signal generator 108 after the filter 120 (which is an input of the calibration peak detector 110) is a sinusoidal signal with a voltage swing equal to a predetermined voltage level (e.g., Vdd1 and Vdd2) during a given time window.

As indicated above, FIG. 3 is provided as an example. Other examples may differ from what is described with regard to FIG. 3. The number and arrangement of components shown in FIG. 3 are provided as an example. In practice, there may be additional components, fewer components, different components, or differently arranged components than those shown in FIG. 3. Furthermore, two or more components shown in FIG. 3 may be implemented within a single component, or a single component shown in FIG. 3 may be implemented as multiple, distributed components. Additionally, or alternatively, a set of components (e.g., one or more components) shown in FIG. 3 may perform one or more functions described as being performed by another set of components shown in FIG. 3.

Figure 4:
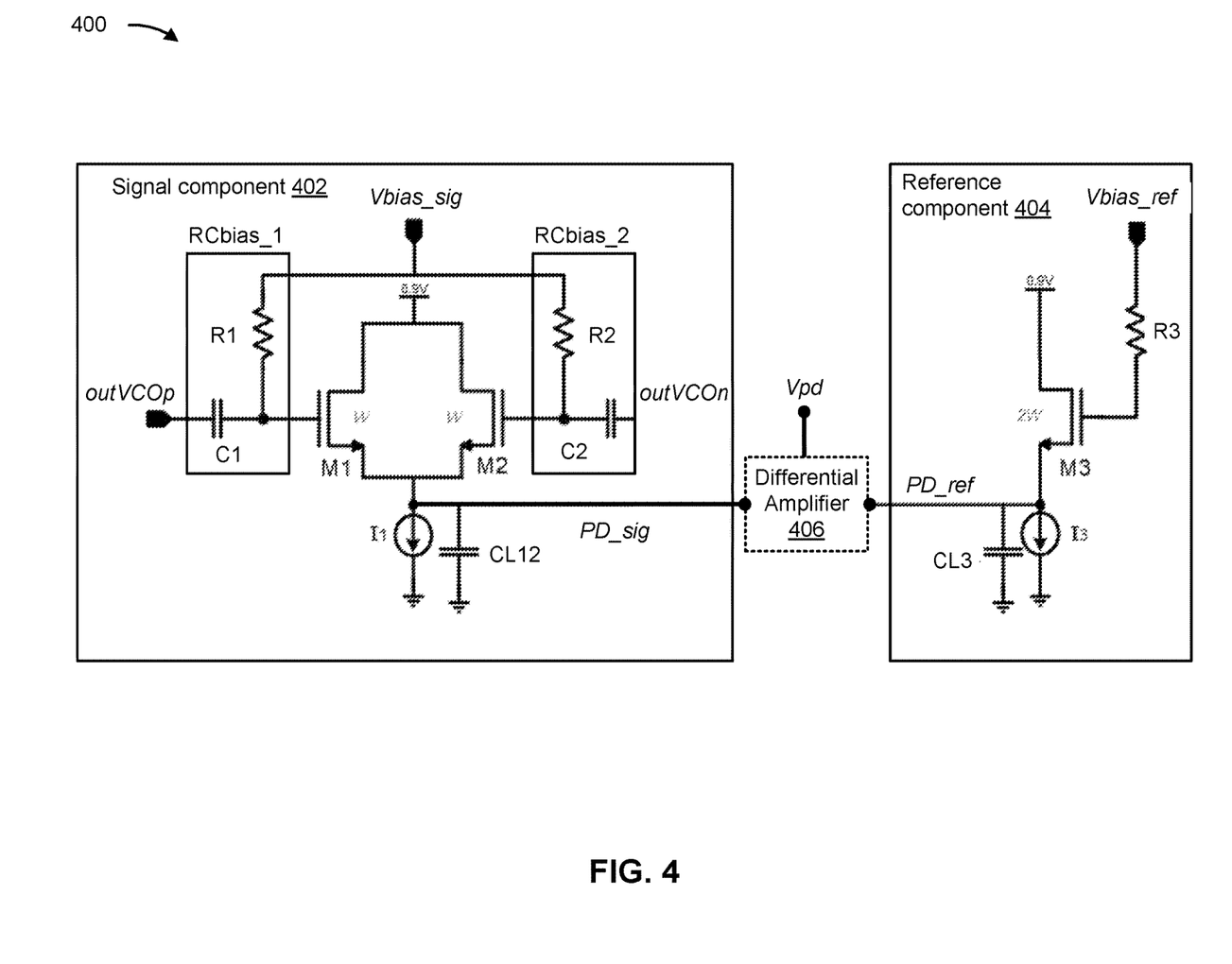
FIG. 4 is a diagram illustrating an example implementation of a peak detector described herein.

FIG. 4 is a diagram illustrating an example implementation of a peak detector 400. In some implementations, the peak detector 400 may correspond to the peak detector 104 and/or the calibration peak detector 110.

In some implementations, as shown in FIG. 4, the peak detector 400 includes a signal component 402 and a reference component 404.

As shown in FIG. 4, the signal component 402 may include a transistor M1, a transistor M2, a resistor-capacitor bias tee RCbias_1, a resistor-capacitor bias tee RCbias_2, and a capacitor CL12. In some implementations, the resistor capacitor bias tee RCbias_1 includes a resistor R1 and a capacitor C1, and the resistor capacitor bias tee RCbias_2 includes a resistor R2 and a capacitor C2. In some implementations, the transistors M1 and M2 have respective gates coupled to oscillator outputs outVCOp and outVCOn. In operation, the transistors M1 and M2 rectify input voltage outVCOp and outVCOn over the capacitance CL12. The resistor capacitor bias tees RCbias_1 and RCbias_2 bias the transistors M1 and M2, respectively. Due to nonlinearities of the transistors M1 and M2, an amplitude of oscillation is collected as a current in the capacitor CL12, and the capacitor CL12 current increases the voltage PD_sig as the amplitude of the oscillator 102 increases.

The reference component 404 may be utilized as a reference and, therefore, has no input. While the oscillator 102 is powered off and has zero amplitude, the voltage PD_sig of the signal component is equal to the reference voltage PD_ref of the reference component 404. As shown in FIG. 4, the reference component 404 may include a transistor M3, which may have twice the channel width of the transistors M1 and M2 in the signal component 402 (e.g., 2 W versus W), and a capacitor CL3. Here, if a current I1, a current I3, the capacitor CL12, the capacitor CL3 and a characteristic of the transistors M1, M2, and M3 are known, then an amplitude of oscillation of the oscillator 102 is directly correlated to an output signal Vpd of the peak detector 400 (e.g., Vpd=Pd_sig−Pd_ref). In some implementations, the output signal Vpd may be a direct current (DC) voltage that is proportional to an amplitude of the voltage swing of the oscillator 102.

As further shown, the peak detector 400 may in some implementations (optionally) include a differential amplifier 406 coupled between the signal component 402 and the reference component 404. In some implementations, the differential amplifier 406 may be configured to amplify a difference between the voltages output by the signal component 402 and the reference component 404 (i.e., a difference between Pd_sig and Pd_ref) to output a signal indicating a peak amplitude detected by the peak detector 400.

As indicated above, FIG. 4 is provided as an example. Other examples may differ from what is described with regard to FIG. 4. The number and arrangement of components shown in FIG. 4 are provided as an example. In practice, there may be additional components, fewer components, different components, or differently arranged components than those shown in FIG. 4. Furthermore, two or more components shown in FIG. 4 may be implemented within a single component, or a single component shown in FIG. 4 may be implemented as multiple, distributed components. Additionally, or alternatively, a set of components (e.g., one or more components) shown in FIG. 4 may perform one or more functions described as being performed by another set of components shown in FIG. 4.

Figure 5:
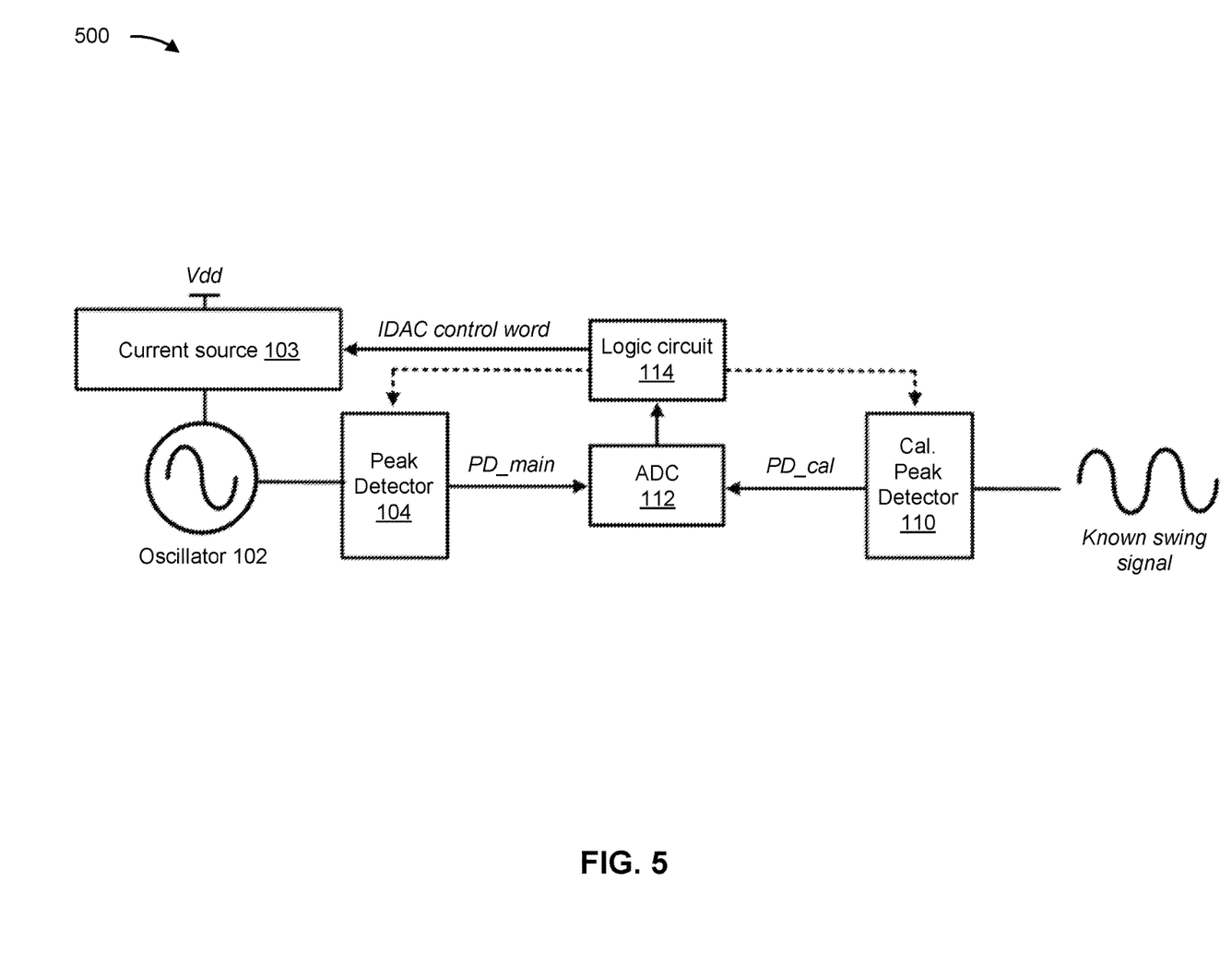
FIG. 5 is a diagram illustrating another example associated with the calibration circuit described herein.

FIG. 5 is a diagram illustrating another example associated with the calibration circuit 106. As shown in FIG. 5, the calibration peak detector 110 is provided with a signal with a known amplitude swing and an output PD_cal (e.g., a DC output) can be used as a reference by the ADC 112 (or a comparator). In combination with the logic circuit 114, this enables the output PD_main (e.g., a DC output) of the peak detector 104 to be matched to the reference, by adjusting the IDAC control word provided to the current source 103 of the oscillator 102. In this way, an amplitude of oscillation (e.g., an amplitude swing) of the oscillator 102 may be monitored and controlled so as to match the amplitude of oscillation to a desired value, thereby minimizing phase noise and reducing a risk of overvoltage and, consequently, phase noise degradation caused by aging.

In this way, the calibration peak detector 110 (e.g., a replica of the peak detector 104) with a known amplitude signal as input can be used to calibrate the peak detector 104 and achieve precise amplitude control of the oscillator 102 over PVT variations. Further, because the input signal of the calibration peak detector 110 is derived directly from the oscillator signal of the oscillator 102 (e.g., with the buffer 118 supplied by the voltage regulator 116), area consumption of the calibration circuit 106 is reduced or minimized.

As indicated above, FIG. 5 is provided as an example. Other examples may differ from what is described with regard to FIG. 5.

Figure 6:
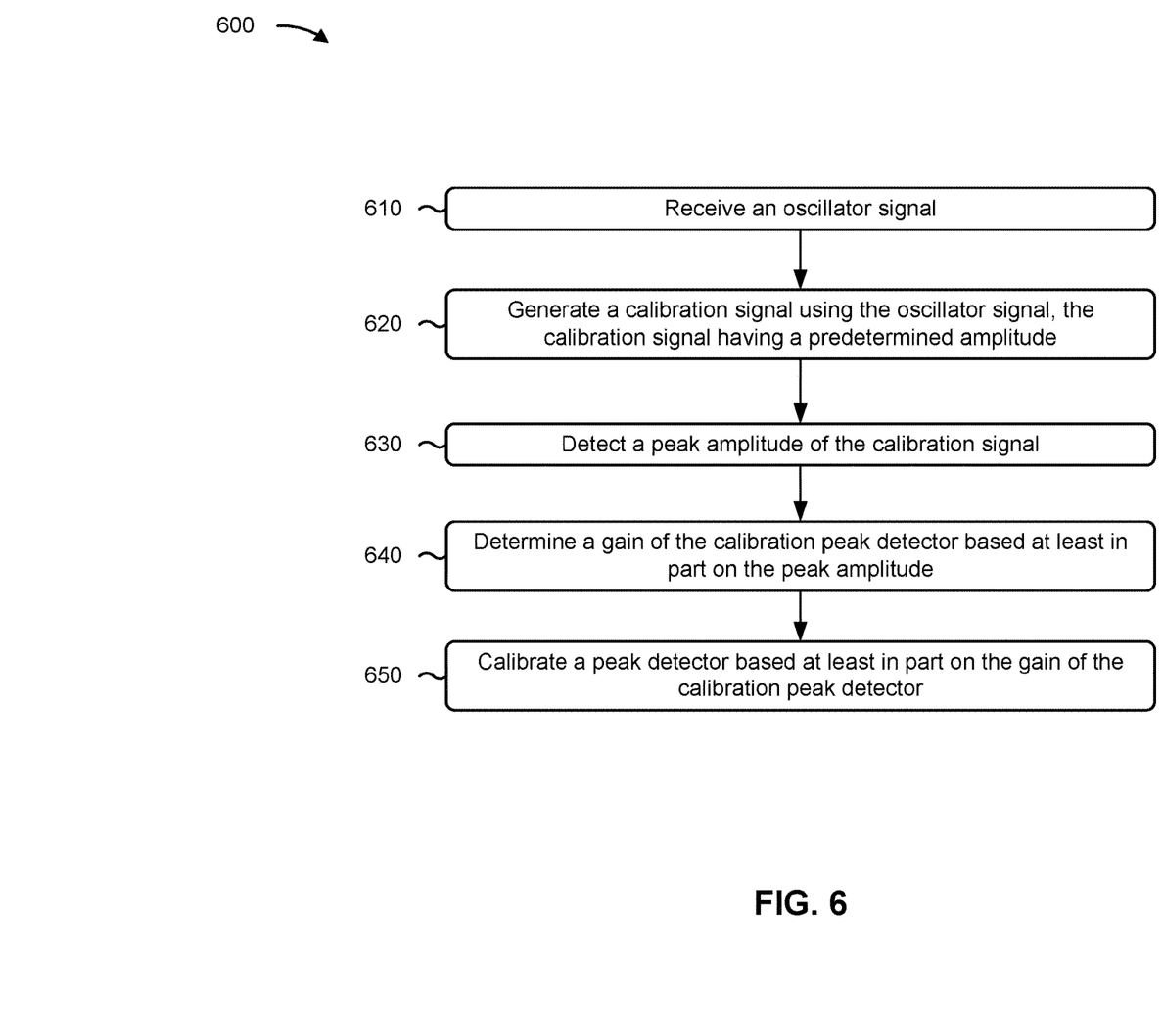
FIG. 6 is a flowchart of an example process associated with peak detector calibration as described herein.

FIG. 6 is a flowchart of an example process 600 associated with peak detector calibration. In some implementations, one or more process blocks of FIG. 6 are performed by a calibration circuit (e.g., calibration circuit 106). In some implementations, one or more process blocks of FIG. 6 are performed by one or more components of calibration circuit 106, such as calibration signal generator 108, calibration peak detector 110, ADC 112, and/or logic circuit 114.

As shown in FIG. 6, process 600 may include receiving an oscillator signal (block 610). For example, the calibration circuit (e.g., the calibration signal generator 108) may receive an oscillator signal, as described above.

As further shown in FIG. 6, process 600 may include generating a calibration signal using the oscillator signal, the calibration signal having a predetermined amplitude (block 620). For example, the calibration circuit (e.g., the calibration signal generator 108) may generate a calibration signal using the oscillator signal, the calibration signal having a predetermined amplitude, as described above.

As further shown in FIG. 6, process 600 may include detecting a peak amplitude of the calibration signal (block 630). For example, the calibration circuit (e.g., the calibration peak detector 110) may detect a peak amplitude of the calibration signal, as described above.

As further shown in FIG. 6, process 600 may include determining a gain of the calibration peak detector based at least in part on the peak amplitude (block 640). For example, the calibration circuit (e.g., the logic circuit 114) may determine a gain of the calibration peak detector based at least in part on the peak amplitude, as described above.

As further shown in FIG. 6, process 600 may include calibrating a peak detector based at least in part on the gain of the calibration peak detector (block 650). For example, the calibration circuit (e.g., the logic circuit 114) may calibrate a peak detector (e.g., the peak detector 104) based at least in part on the gain of the calibration peak detector, as described above.

Process 600 may include additional implementations, such as any single implementation or any combination of implementations described below and/or in connection with one or more other processes described elsewhere herein.

In a first implementation, the predetermined amplitude is a first amplitude generated during a first time window and is a second amplitude during a second time window.

In a second implementation, alone or in combination with the first implementation, detecting the peak amplitude comprises detecting a first peak amplitude during the first time window and detecting a second peak amplitude during the second time window.

In a third implementation, alone or in combination with one or more of the first and second implementations, the gain of the calibration peak detector is determined based at least in part on the first peak amplitude and the second peak amplitude.

In a fourth implementation, alone or in combination with one or more of the first through third implementations, the calibration signal is generated to have a guaranteed rail-to-rail swing.

In a fifth implementation, alone or in combination with one or more of the first through fourth implementations, generating the calibration signal comprises supplying a buffer with a selected supply voltage.

In a sixth implementation, alone or in combination with one or more of the first through fifth implementations, generating the calibration signal comprises filtering the calibration signal to cause the calibration signal to have a sinusoidal waveform.

In a seventh implementation, alone or in combination with one or more of the first through sixth implementations, process 600 includes sampling and converting, by an analog-to-digital converter, an output signal of the calibration peak detector.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item. No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items,), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A calibration circuit, comprising:
    a calibration signal generator configured to:
        receive an oscillator signal provided by an oscillator, and
        generate a calibration signal based on the oscillator signal, the calibration signal being generated to have a predetermined amplitude;
    a calibration peak detector configured to detect a peak amplitude of the calibration signal; and
    a logic circuit configured to calibrate a peak detector, connected to the oscillator for detecting a peak of the oscillator signal, based at least in part on the peak amplitude of the calibration signal.

2. The calibration circuit of claim 1, wherein the predetermined amplitude is a first amplitude during a first time window and is a second amplitude during a second time window.

3. The calibration circuit of claim 2, wherein the calibration peak detector is configured to, when detecting the peak amplitude, detect a first peak amplitude of the calibration signal during the first time window and to detect a second peak amplitude of the calibration signal during the second time window.

4. The calibration circuit of claim 3, wherein the logic circuit, to calibrate the peak detector, is configured to calibrate the peak detector based at least in part on the first peak amplitude and the second peak amplitude.

5. The calibration circuit of claim 1, wherein the calibration signal generator is configured to generate the calibration signal such that the calibration signal is guaranteed to have a rail-to-rail swing during a given time window.

6. The calibration circuit of claim 1, wherein the calibration signal generator comprises a voltage regulator configured to supply a supply voltage, and
    wherein the calibration signal generator comprises a buffer configured to receive the oscillator signal and generate the calibration signal based on the oscillator signal and the supply voltage supplied to the buffer.

7. The calibration circuit of claim 6, wherein the buffer outputs a rail-to-rail signal.

8. The calibration circuit of claim 1, further comprising an analog-to-digital converter configured to sample and convert an output signal of the calibration peak detector and provide a sampled and converted output signal to the logic circuit.

9. The calibration circuit of claim 1, wherein the calibration peak detector is a replica of the peak detector.

10. The calibration circuit of claim 1, wherein the calibration signal generator comprises:
    a voltage regulator configured to generate a selectable supply voltage based on a supply voltage and a selection signal; and a buffer configured to receive the oscillator signal and the selectable supply voltage, and generate the calibration signal based on the oscillator signal and the selectable supply voltage.

11. The calibration circuit of claim 10, wherein the calibration signal generator comprises:
a filter configured to modify a waveform of the calibration signal to cause the calibration signal to have a sinusoidal waveform, and provide the calibration signal, having the sinusoidal waveform, to the calibration peak detector.

12. The calibration circuit of claim 10, wherein the voltage regulator is configured to, based on the selection signal, generate the selectable supply voltage as a first selectable supply voltage during a first time window, and generate the selectable supply voltage as a second selectable supply voltage during a second time window.

13. The calibration circuit of claim 12, wherein the calibration peak detector is configured to, when detecting the peak amplitude, detect a first peak amplitude of the calibration signal during the first time window and to detect a second peak amplitude of the calibration signal during the second time window, and
wherein the predetermined amplitude is a first amplitude during the first time window and is a second amplitude during the second time window.

14. The calibration circuit of claim 13, wherein the logic circuit, to calibrate the peak detector, is configured to calibrate the peak detector based at least in part on the first peak amplitude and the second peak amplitude.

15. A method, comprising:
receiving, by a calibration signal generator, an oscillator signal from an oscillator;
generating, by the calibration signal generator, a calibration signal using the oscillator signal, the calibration signal having a predetermined amplitude;
detecting, by a calibration peak detector, a peak amplitude of the calibration signal;
determining, by a logic circuit, a gain of the calibration peak detector based at least in part on the peak amplitude; and
calibrating, by the logic circuit, a peak detector based at least in part on the gain of the calibration peak detector, wherein the peak detector is connected to the oscillator for detecting a peak of the oscillator signal.

16. The method of claim 15, wherein the predetermined amplitude is a first amplitude during a first time window and is a second amplitude during a second time window.

17. The method of claim 16, wherein detecting the peak amplitude comprises detecting a first peak amplitude during the first time window and detecting a second peak amplitude during the second time window.

18. The method of claim 17, wherein the gain of the calibration peak detector is determined based at least in part on the first peak amplitude and the second peak amplitude.

19. The method of claim 15, wherein the calibration signal is generated to have a guaranteed rail-to-rail swing.

20. The method of claim 15, wherein generating the calibration signal comprises supplying a buffer with a selected supply voltage.

21. The method of claim 15, wherein generating the calibration signal comprises filtering the calibration signal to cause the calibration signal to have a sinusoidal waveform.

22. The method of claim 15, further comprising sampling and converting, by an analog-to-digital converter, an output signal of the calibration peak detector.

23. A calibration circuit, comprising:
a voltage regulator configured to supply a buffer with a selectable supply voltage;
the buffer configured to receive an oscillator signal from an oscillator, and generate a calibration signal based on the oscillator signal and the selectable supply voltage;
a filter configured to modify a waveform of the calibration signal;
a calibration peak detector configured to detect peak amplitudes of the calibration signal, having been modified by the filter; and
a logic circuit configured to calibrate a peak detector, connected to the oscillator for detecting peaks of the oscillator signal, based at least in part on the peak amplitudes of the calibration signal.

* * * * *